United States Patent
Wei et al.

(10) Patent No.: US 11,784,650 B2
(45) Date of Patent: Oct. 10, 2023

(54) CALIBRATION METHOD, CALIBRATION DEVICE AND MULTI-PHASE CLOCK CIRCUIT

(71) Applicant: MONTAGE TECHNOLOGY CO., LTD., Shanghai (CN)

(72) Inventors: Kang Wei, Shanghai (CN); Liang Zhang, Shanghai (CN)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 17/964,938

(22) Filed: Oct. 13, 2022

(65) Prior Publication Data
US 2023/0121503 A1 Apr. 20, 2023

(30) Foreign Application Priority Data
Oct. 14, 2021 (CN) .......................... 202111199621.3

(51) Int. Cl.
*H03L 7/081* (2006.01)
*H03L 7/083* (2006.01)
*H03L 7/183* (2006.01)

(52) U.S. Cl.
CPC ............ *H03L 7/0818* (2013.01); *H03L 7/083* (2013.01); *H03L 7/183* (2013.01)

(58) Field of Classification Search
CPC ........ H03L 7/0818; H03L 7/083; H03L 7/183
See application file for complete search history.

(56) References Cited

U.S. PATENT DOCUMENTS

| | | | | |
|---|---|---|---|---|
| 7,236,028 B1 * | 6/2007 | Choi | ..................... | H03L 7/0814 327/158 |
| 9,432,025 B1 * | 8/2016 | Khor | ..................... | H03L 7/0891 |
| 10,530,371 B2 * | 1/2020 | Jeon | ........................ | H03L 7/087 |
| 11,418,177 B2 * | 8/2022 | Hsu | ........................ | H03K 5/01 |
| 2013/0162312 A1 * | 6/2013 | Jung | ..................... | H03L 7/0818 327/158 |
| 2013/0249618 A1 * | 9/2013 | Kwak | ................... | H03L 7/0816 327/355 |
| 2014/0225651 A1 * | 8/2014 | Haerle | ..................... | H03L 7/10 327/142 |

(Continued)

FOREIGN PATENT DOCUMENTS

WO    WO-2021213668 A1 * 10/2021 ............. H03L 7/081

*Primary Examiner* — Adam D Houston

(57) ABSTRACT

The application provides a calibration method, a calibration device and a multi-phase clock circuit. The method includes: gating each of multi-phase clock signals as a first primary clock signal and gating a corresponding clock signal as a first auxiliary clock signal according to a first preset rule; gating each of the multi-phase clock signals as a second primary clock signal and gating a corresponding clock signal as a second auxiliary clock signal according to a second preset rule; obtaining a time difference between each primary clock signal and its corresponding auxiliary clock signal under the first preset rule and the second preset rule; determining a delay adjustment amount of each primary clock signal according to the time difference, and obtaining a phase error between the multi-phase clock signals according to the delay adjustment amount; and obtaining a calibration amount of the multi-phase clock signals according to the phase error.

14 Claims, 5 Drawing Sheets

(56) References Cited

U.S. PATENT DOCUMENTS

2016/0373119 A1* 12/2016 Wei .................... G11C 7/1093
2023/0121503 A1*  4/2023 Wei .................... H03L 7/0818
                                                    327/158

* cited by examiner

CALIBRATION METHOD, CALIBRATION DEVICE AND MULTI-PHASE CLOCK CIRCUIT

CROSS REFERENCE TO RELATED APPLICATIONS

The present application claims the benefit of priority to Chinese Patent Application No. CN 202111199621.3, entitled "CALIBRATION METHOD, CALIBRATION DEVICE AND MULTI-PHASE CLOCK CIRCUIT", filed with CNIPA on Oct. 14, 2021, the contents of which are incorporated herein by reference in its entirety.

FIELD OF THE TECHNOLOGY

The present application belongs to the field of electronic circuits, in particular, to a calibration method, a calibration device and a multi-phase clock circuit.

BACKGROUND

In a typical multi-phase clock circuit, multi-phase clock signals are usually output by a Phase Locked Loop (PLL) and then pass through a multiplexer to drive a post-stage circuit, thus meeting the clock requirements of the post-stage circuit. However, the inventors found that there is an error between the phase difference of the final output of the clock and the reference phase difference in practice due to differences between the clock tree and physical implementation. Therefore, how to calibrate the phase difference of the multi-phase clock circuit has become one of the urgent technical problems to be solved for those skilled in the related field.

SUMMARY

The present disclosure provides a calibration method, a calibration device and a multi-phase clock circuit.

The calibration method includes: gating each phase clock signal of multi-phase clock signals as a first primary clock signal respectively and gating a corresponding clock signal as a corresponding first auxiliary clock signal respectively according to a first preset rule, where a reference phase difference between the first primary clock signal and its corresponding first auxiliary clock signal under the first preset rule is a first predetermined value; gating each phase clock signal of the multi-phase clock signals as a second primary clock signal respectively and gating a corresponding clock signal as a corresponding second auxiliary clock signal respectively according to a second preset rule, where a reference phase difference between the second primary clock signal and its corresponding second auxiliary clock signal under the second preset rule is a second predetermined value, where the first predetermined value is not equal to the second predetermined value; obtaining a time difference between each primary clock signal and its corresponding auxiliary clock signal under the first preset rule and the second preset rule; determining a delay adjustment amount of each primary clock signal according to the time difference, and obtaining a phase error between the multi-phase clock signals according to the delay adjustment amount; and obtaining a calibration amount of the multi-phase clock signals according to the phase error.

In an embodiment of the present disclosure, said determining of the delay adjustment amount of each primary clock signal according to the time difference includes: obtaining a frequency signal corresponding to the time difference; and obtaining the delay adjustment amount of each primary clock signal according to the frequency signal.

In an embodiment of the present disclosure, said obtaining of the phase error between the multi-phase clock signals according to the delay adjustment amount includes:

$$\Delta t(k+1, k) = -\left(\sum_{n=0}^{m}(c_A(n) - c_B(n))\right)/(m+1) + c_A(k) - c_B(k),$$

where $\Delta t(k+1,k)$ is a phase error between the $k_{th}$ phase clock signal and the $(k+1)_{th}$ phase clock signal, m+1 is a phase number of the multi-phase clock signals, $c_A(n)$ is a delay adjustment amount of the $n_{th}$ phase clock signal under the first preset rule; $c_B(n)$ is a delay adjustment amount of the $n_{th}$ phase clock signal under the second preset rule.

In an embodiment of the present disclosure, said obtaining of the calibration amount of the multi-phase clock signals according to the phase error includes:

$$c(k) = \begin{cases} 0, k=0 \\ \sum_{i=1}^{k}\Delta t(i, i-1), 0 < k < m+1 \end{cases},$$

where c(k) is a calibration amount of the $k_{th}$ phase clock signal.

In an embodiment of the present disclosure, the first predetermined value is $2\times\pi/(m+1)$, and the second predetermined value is $4\times\pi/(m+1)$ where m+1 is the number of phases of the multi-phase clock signals.

The present disclosure further provides a calibration device. The calibration device includes a primary selector, an auxiliary selector, a time difference obtaining module, a controller, and a delay adjustment module.

The primary selector receives multi-phase clock signals and selects, under the control of a controller, a phase clock signal output from the multi-phase clock signals as a primary clock signal.

The auxiliary selector receives the multi-phase clock signals and selects, under the control of the controller, a corresponding phase clock signal output from the multi-phase clock signals as an auxiliary clock signal. A reference phase difference between the primary clock signal and the auxiliary clock signal is a predetermined value, and the predetermined value is a value not equal to zero.

The time difference obtaining module receives the primary clock signal and the auxiliary clock signal and obtains a time difference between the primary clock signal and the auxiliary clock signal.

The controller is connected to the primary selector, the auxiliary selector and the time difference obtaining module. The controller determines a delay adjustment amount of the primary clock signal according to the time difference between the primary clock signal and the auxiliary clock signal.

The delay adjustment module is connected to the primary selector and the controller, and adjusts a delay of the primary clock signal according to the delay adjustment amount such that a phase difference between the primary clock signal and the auxiliary clock signal is equal to or close to the predetermined value.

In an embodiment of the present disclosure, the controller further controls the primary selector to gate each phase clock signal of the multi-phase clock signals as a first primary clock signal respectively and controls the auxiliary selector to gate a corresponding clock signal as a corresponding first auxiliary clock signal respectively according to a first preset rule, and controls the primary selector to gate each phase clock signal of the multi-phase clock signals as a second primary clock signal respectively and controls the auxiliary selector to gate a corresponding clock signal as a corresponding second auxiliary clock signal respectively according to a second preset rule. A reference phase difference between the first primary clock signal and its corresponding first auxiliary clock signal under the first preset rule is a first predetermined value, and a reference phase difference between the second primary clock signal and its corresponding second auxiliary clock signal under the second preset rule is a second predetermined value. The first predetermined value is not equal to the second predetermined value.

In an embodiment of the present disclosure, the time difference obtaining module obtains a time difference between each primary clock signal and its corresponding auxiliary clock signal under the first preset rule and the second preset rule. The controller determines a delay adjustment amount of each primary clock signal based on the time difference, then obtains a phase error between the multi-phase clock signals based on the delay adjustment amount, and afterwards obtains a calibration amount of the multi-phase clock signals based on the phase error.

In an embodiment of the present disclosure, the calibration device further includes a frequency conversion module. The frequency conversion module is connected between the time difference obtaining module and the controller for receiving the time difference between the primary clock signal and its corresponding auxiliary clock signal and acquiring a frequency signal corresponding to the time difference according to the time difference. The controller obtains the delay adjustment amount of each primary clock signal according to the frequency signal.

In an embodiment of the present disclosure, the controller obtains the phase error between the multi-phase clock signals according to the following equation:

$$\Delta t(k+1, k) = -\left(\sum_{n=0}^{m}(c_A(n) - c_B(n))\right)/(m+1) + c_A(k) - c_B(k),$$

where $\Delta t(k+1,k)$ is a phase error between the $k_{th}$ phase clock signal and the $(k+1)_{th}$ phase clock signal, m+1 is a phase number of the multi-phase clock signals, $c_A(n)$ is a delay adjustment amount of the $n_{th}$ phase clock signal under the first preset rule; $c_B(n)$ is a delay adjustment amount of the $n_{th}$ phase clock signal under the second preset rule.

In an embodiment of the present disclosure, the controller obtains the calibration amount of the multi-phase clock signals according to the following equation:

$$c(k) = \begin{cases} 0, k = 0 \\ \sum_{i=1}^{k}\Delta t(i, i-1), 0 < k < m+1 \end{cases},$$

where c(k) is a calibration amount of the $k_{th}$ phase clock signal.

In an embodiment of the present disclosure, the delay adjustment module is connected between an output end of the primary selector and an input end of the time difference obtaining module.

In an embodiment of the present disclosure, one said delay adjustment module is connected between each phase clock signal of the multi-phase clock signals and a corresponding input end of the primary selector.

In an embodiment of the present disclosure, the first predetermined value is $2\times\pi/(m+1)$, and the second predetermined value is $4\times\pi/(m+1)$ where m+1 is the number of phases of the multi-phase clock signals.

The present disclosure further provides a multi-phase clock circuit. The multi-phase clock circuit includes a clock signal generation circuit, a primary selector, an auxiliary selector, a time difference obtaining module, a controller, and a delay adjustment module.

The clock signal generation circuit generates multi-phase clock signals.

The primary selector receives the multi-phase clock signals and selects, under the control of a controller, a phase clock signal output from the multi-phase clock signals as a primary clock signal.

The auxiliary selector receives the multi-phase clock signals and selects, under the control of the controller, a corresponding phase clock signal output from the multi-phase clock signals as an auxiliary clock signal, where a reference phase difference between the primary clock signal and the auxiliary clock signal is a predetermined value, and the predetermined value is a value not equal to zero.

The time difference obtaining module receives the primary clock signal and the auxiliary clock signal and obtains a time difference between the primary clock signal and the auxiliary clock signal.

The controller is connected to the primary selector, the auxiliary selector and the time difference obtaining module, and determines a delay adjustment amount of the primary clock signal according to the time difference between the primary clock signal and the auxiliary clock signal.

The delay adjustment module is connected to the primary selector and the controller, and adjusts a delay of the primary clock signal according to the delay adjustment amount such that a phase difference between the primary clock signal and the auxiliary clock signal is equal to or close to the predetermined value.

DETAILED DESCRIPTION

The specific embodiments will be described below to illustrate the implementation of the present disclosure. Those skilled can easily understand other advantages and effects of the present disclosure according to contents disclosed by the specification. The present disclosure can also be implemented or applied through other different specific embodiments. Various modifications or changes can also be made to all details in the specification based on different points of view and applications without departing from the spirit of the present disclosure. It needs to be stated that the following embodiments and the features in the embodiments can be combined with one another under the situation with no conflict.

It needs to be stated that the drawings provided in the following embodiments are just used for schematically describing the basic concept of the present disclosure, thus components only related to the present disclosure are illustrated and are not drawn according to the numbers, shapes and sizes of components during actual implementation, the configuration, number and scale of each component during actual implementation thereof may be freely changed, and the component layout configuration thereof may be more complicated. Furthermore, in the specification, relationship terms such as "first", "second", etc. are used only to distinguish one entity or operation from another. No such actual relationship or sequence between these entities or operations is necessarily required or implied.

Figure 1:
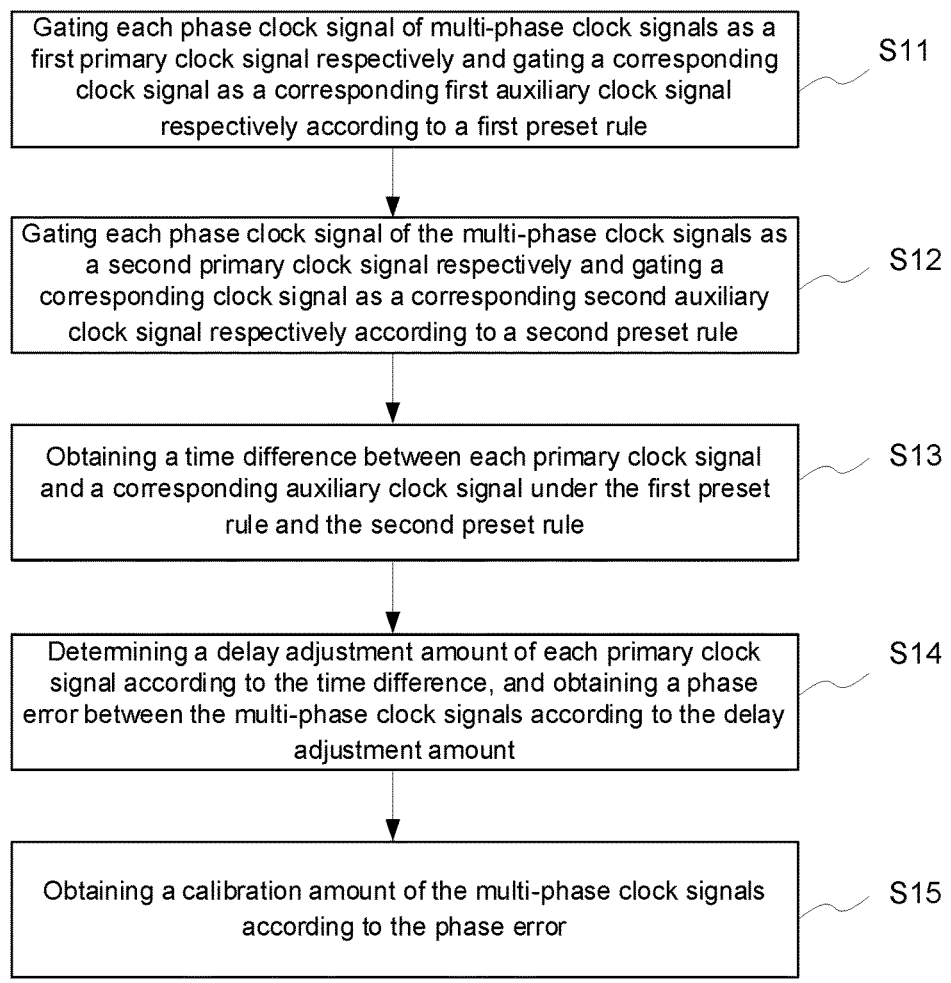
FIG. 1 shows a flowchart of a calibration method according to an embodiment of the present disclosure.

Most of current multi-phase clock calibration techniques are based on phase frequency detectors and low-frequency filters, combined with digital control, to adjust the control voltage of voltage-controlled oscillator (VCO) or the multi-phase output delay of phase-locked loop (PLL) for calibration purposes. However, adjusting the control voltage of the VCO is difficult to be directly applied to multi-output circuits, and adjusting the multi-phase output delay of the PLL has the problems of excessive hardware cost and power consumption. The present disclosure provides a calibration method, referring to FIGS. 1 and 2, the calibration method includes:

S11, gating each phase clock signal of multi-phase clock signals as a first primary clock signal respectively and gating a corresponding clock signal as a corresponding first auxiliary clock signal respectively according to a first preset rule, and a reference phase difference between the first primary clock signal and its corresponding first auxiliary clock signal under the first preset rule is a first predetermined value.

The multi-phase clock signals may be clk_p0, clk_p1, . . . , clk_pm, where m is an integer greater than 1. Taking a four phase clock signal (i.e., m=3) as an example and referring to FIG. 2, a four phase clock signal generation circuit outputs four phase clock signals, (i.e., clk_p0, clk_p1, clk_p2 and clk_p3, respectively), and the reference phase differences between two adjacent phase clock signals in clk_p0, clk_p1, clk_p2 and clk_p3 are $\pi/2$. A primary selector and an auxiliary selector are used to receive the four phase clock signals and gate the corresponding phase clock signals under the control of a controller, respectively. Under the first preset rule, the controller, by controlling the primary selector, causes the primary selector to gate each phase clock signal of the four phase clock signals as the first primary clock signal output through the primary selector, i.e., causes clk_p0, clk_p1, clk_p2 and clk_p3 as the first primary clock signal in turn output through the primary selector. At the same time, the controller controls the auxiliary selector, so that the auxiliary selector gates each corresponding clock signal as the first auxiliary clock signal output through the auxiliary selector. The reference phase difference between each first primary clock signal and its corresponding first auxiliary clock signal is the first predetermined value. The first predetermined value may be set according to actual requirements, for example, the first predetermined value may be $2\times\pi/(m+1)$. Therefore, for the four phase clock signal, the first predetermined value is $\pi/2$, that is, when the controller controls the primary selector to gate clk_p0 as the first primary clock signal, correspondingly, the controller may control the auxiliary selector to gate the clock signal clk_p1 as the first auxiliary clock signal, where the reference phase difference between clk_p0 and clk_p1 is $\pi/2$ that is, when clk_p0 is the first primary clock signal, its corresponding first auxiliary clock signal is clk_p1. Similarly, when clk_p1 is the first primary clock signal, its corresponding first auxiliary clock signal is clk_p2, when clk_p2 serves as the first primary clock signal, its corresponding first auxiliary clock signal is clk_p3, and when clk_p3 serves as the first primary clock signal, its corresponding first auxiliary clock signal is clk_p0.

S12, gating each phase clock signal of the multi-phase clock signals as a second primary clock signal respectively and gating a corresponding clock signal as a corresponding second auxiliary clock signal respectively according to a second preset rule, and a reference phase difference between the second primary clock signal and its corresponding second auxiliary clock signal under the second preset rule is a second predetermined value.

Figure 2:
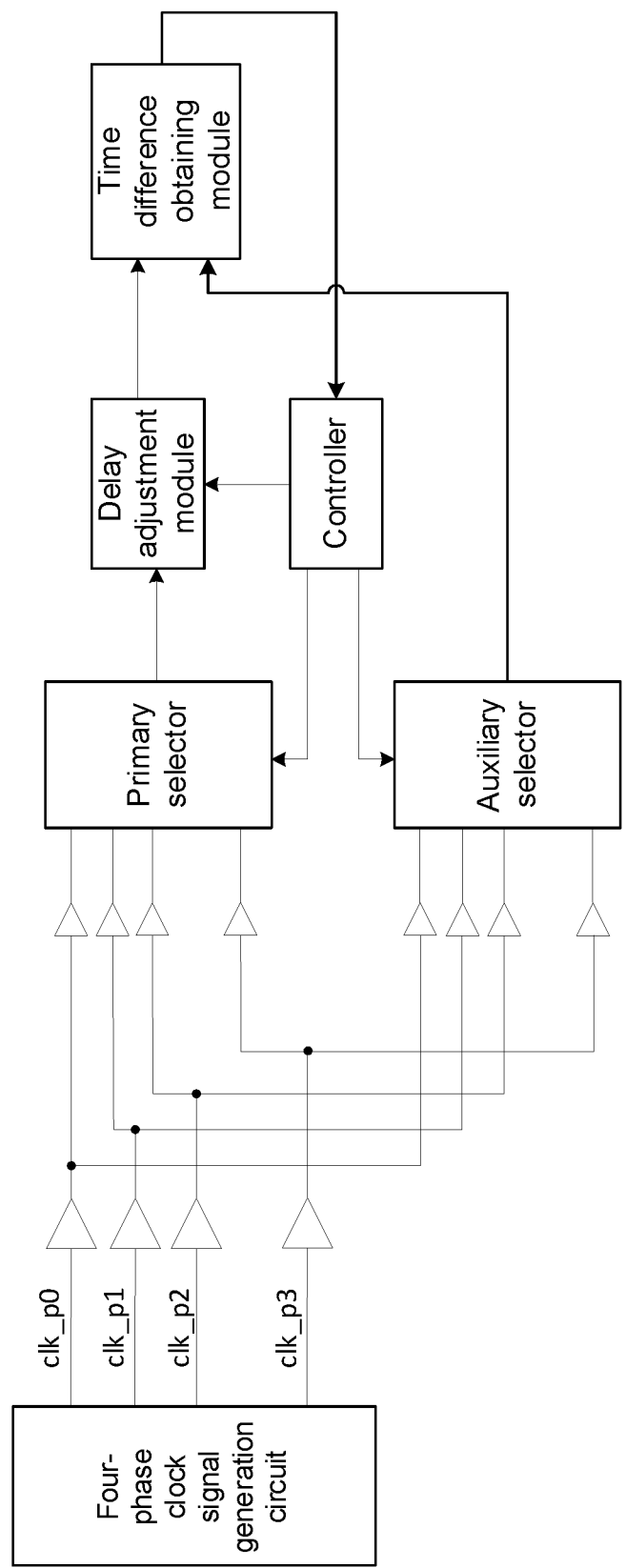
FIG. 2 shows a schematic structural diagram of a calibration device according to an embodiment of the present disclosure.

As shown in FIG. 2, similarly, under the second preset rule, the controller, by controlling the primary selector, causes the primary selector to gate each phase clock signal of the four phase clock signals as the primary clock signal output through the primary selector, i.e., causes clk_p0, clk_p1, clk_p2 and clk_p3 as the second primary clock signal in turn output through the primary selector. At the same time, the controller controls the auxiliary selector, so that the auxiliary selector gates each corresponding clock signal as the second auxiliary clock signal output through the auxiliary selector. The reference phase difference between each second primary clock signal and its corresponding second auxiliary clock signal is the second predetermined value, and the second predetermined value is not equal to the first predetermined value. The second predetermined value can be set according to actual requirements, for example, the second predetermined value can be $4\times\pi/(m+1)$. Therefore, for the four phase clock signal, the second predetermined value is $\pi$, that is, when the controller controls the primary selector to gate clk_p0 as the second primary clock signal, correspondingly, the controller will control the auxiliary selector to gate the clock signal clk_p2 as the second auxiliary clock signal, where the reference phase difference between clk_p0 and clk_p2 is $\pi$, that is, when clk_p0 is the second primary clock signal, its corresponding second auxiliary clock signal is clk_p2. Similarly, when clk_p1 is the second primary clock signal, its corresponding second auxiliary clock signal is clk_p3, when clk_p2 serves as the second primary clock signal, its corresponding second auxiliary clock signal is clk_p0, and when clk_p3 serves as the second primary clock signal, its corresponding second auxiliary clock signal is clk_p1.

S13, obtaining a time difference between each primary clock signal and its corresponding auxiliary clock signal under the first preset rule and the second preset rule.

As shown in FIG. 2, a time difference obtaining module connects the primary selector and the auxiliary selector for receiving the primary clock signal output by the primary selector and the auxiliary clock signal output by the auxiliary selector and obtaining the time difference $t(pi, pj\_dmy)$ between each primary clock signal and its corresponding auxiliary clock signal, where pi represents the primary clock signal, and pj_dmy represents the auxiliary clock signal.

S14, determining a delay adjustment amount of each primary clock signal according to the time difference, and then obtaining a phase error between the multi-phase clock signals according to the delay adjustment amount.

In an embodiment, as shown in FIG. 2, the controller may calculate the delay adjustment amount of the primary clock signal based on the time difference output by the time difference obtaining module.

Figure 3A:
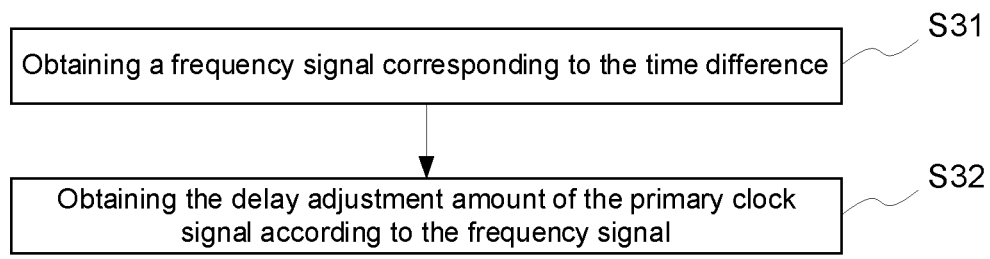
FIG. 3A shows a flowchart of key steps of a calibration method according to an embodiment of the present disclosure.

In another embodiment, as shown in FIG. 3A, the determining of the delay adjustment amount of each primary clock signal according to the time difference includes:

S31, obtaining a frequency signal corresponding to the time difference.

Figure 3B:
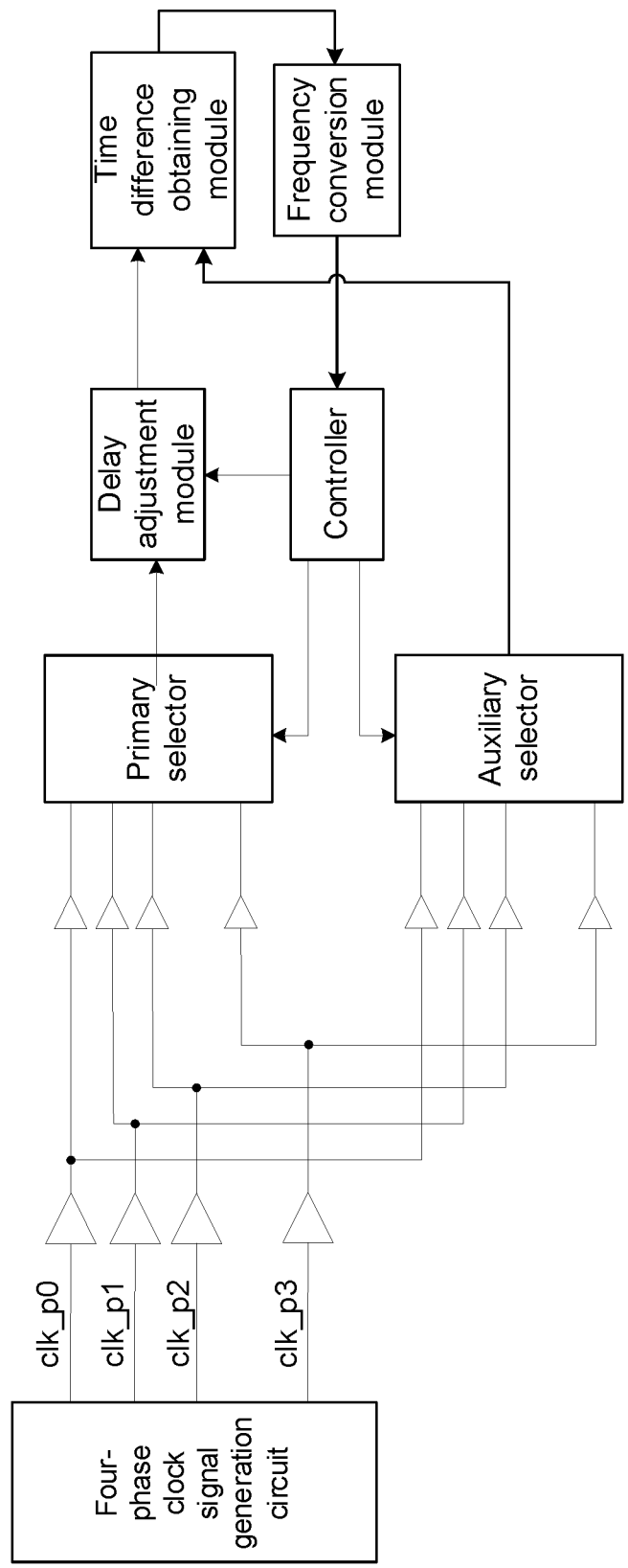
FIG. 3B shows a schematic structural diagram of a calibration device according to an embodiment of the present disclosure.

Optionally, as shown in FIG. 3B, a frequency conversion module (such as a current controlled oscillator (ICO)) may be connected between the time difference obtaining module and the controller. The frequency conversion module receives the time difference output by the time difference obtaining module, then converts the time difference into a frequency signal, and sends the converted frequency signal to the controller.

S32, obtaining the delay adjustment amount of the primary clock signal according to the frequency signal.

Specifically, the controller may obtain the delay adjustment amount of each primary clock signal based on the frequency signal sent by the frequency conversion module.

As mentioned above, under the first preset rule and the second preset rule, the controller controls the primary selector to make each phase clock signal of the multi-phase clock signals as the primary clock signal in turn, so the controller can obtain the delay adjustment amount of each phase clock signal under the first preset rule and the delay adjustment amount of each phase clock signal under the second preset rule.

After obtaining the delay adjustment amount of the primary clock signal, the controller can control a delay adjustment module to adjust the delay of the primary clock signal, so that the phase difference between the primary clock signal and its corresponding auxiliary clock signal is equal to or close to a predetermined value. The phase difference is close to the predetermined value means that the difference between the phase difference and the predetermined value is less than a predetermined threshold which can be set according to the actual requirements. Under the first preset rule, the predetermined value is the first predetermined value, and under the second preset rule, the predetermined value is the second predetermined value.

In an embodiment, the obtaining of the phase error between the multi-phase clock signals according to the delay adjustment amount by the controller includes:

$$\Delta t(k+1, k) = -\left(\sum_{n=0}^{m}(c_A(n) - c_B(n))\right)/(m+1) + c_A(k) - c_B(k),$$

where $\Delta t(k+1,k)$ is a phase error between the $k_{th}$ phase clock signal and the $(k+1)_{th}$ phase clock signal, $m+1$ is a phase number of the multi-phase clock signals, $c_A(n)$ is a delay adjustment amount of the $n_{th}$ phase clock signal under the first preset rule; $c_B(n)$ is a delay adjustment amount of the $n_{th}$ phase clock signal under the second preset rule.

The formula for calculating the above phase error may be obtained by the following ways.

Under the first preset rule, after adjusting the delay of the primary clock signal according to the obtained delay adjustment amount of the primary clock signal, the phase difference between each primary clock signal and its corresponding auxiliary clock signal is equal to or close to the first predetermined value $d_A$, from which it is known that t(p1, p2_dmy)−$c_A(0)$=t(p2, p3_dmy)−$c_A(1)$= . . . =t(pk, p0_dmy)−$c_A(m-1)$=t(p0, p1_dmy)−$c_A(m)$=$d_A$, where t(pi, pj_dmy) is a time difference between the $i_{th}$ phase primary clock signal and the corresponding $j_{th}$ phase auxiliary clock signal, $c_A(i)$ is a delay adjustment amount corresponding to the $i_{th}$ phase primary clock signal.

Under the second preset rule, after adjusting the delay of the primary clock signal according to the obtained delay adjustment amount of the primary clock signal, the phase difference between each primary clock signal and its corresponding auxiliary clock signal is equal to or close to the second predetermined value $d_B$, so, t(p0, p2_dmy)−$c_B(0)$=t(p1, p3_dmy)−$c_B(1)$= . . . =t(pk−1, p0_dmy)−$c_B(m-1)$=t(pm, p1_dmy)−$c_B(m)$=$d_B$, where $c_B(i)$ is a delay adjustment amount corresponding to the $i_{th}$ phase clock signal.

The above equations of $d_A$ and $d_B$ both include the phase differences introduced by two clock paths (primary clock signal path and auxiliary clock signal path), and if subtracting $d_B$ from $d_A$, then the phase difference introduced by the auxiliary clock signal path can be offset, and the following equations can be obtained:

$$t(p1, p0) = d_A - d_B + c_A(0) - c_B(0) \tag{1}$$

$$t(p2, p1) = d_A - d_B + c_A(1) - c_B(1) \tag{2}$$

. . .

$$t(pm, pm-1) = d_A - d_B + c_A(m-1) - c_B(m-1)(m)$$

$$t(p0, pm) = d_A - d_B + c_A(m) - c_B(m)(m+1)$$

The above equations (1) and (2) (m) and (m+1) are added and equal to −T (T represents the period), which leads to:

$$\Delta d = d_A - d_B = -\left(\sum_{n=0}^{m}(c_A(n) - c_B(n)) + T\right)/(m+1);$$

The equation $$\Delta d = d_A - d_B = -\left(\sum_{n=0}^{m}(c_A(n) - c_B(n)) + T\right)/(m+1)$$

is substituted into the above equations (1), (2) . . . (m−1), (m), which leads to:

$$t(pk+1, pk) = -\left(\sum_{n=0}^{m}(c_A(n) - c_B(n)) + T\right)/(m+1) + c_A(k) - c_B(k),$$

It can be further obtained that $$\Delta t(k+1, k) =$$

$$tp(k+p1k, +T)m/ + \left(= -1\sum_{n=0}^{m} c_A(n - (c_B(n)m(+)) + c_A(k) - c_B(k, \text{ i.e., .:}\right.$$

$$\Delta t(k+1, k) = -\left(\sum_{n=0}^{m}(c_A(n) - c_B(n))\right)/(m+1) + c_A(k) - c_B(k)$$

S15, obtaining a calibration amount of the multi-phase clock signals according to the phase error.

In an embodiment, after obtaining the phase error, the obtaining of the calibration amount of the multi-phase clock signals according to the phase error includes:

$$c(k) = \begin{cases} 0, k = 0 \\ \sum_{i=1}^{k} \Delta t(i, i-1), 0 < k < m+1 \end{cases},$$

where c(k) is a calibration amount of the $k_{th}$ phase clock signal.

Preferably, if min(c(0), c(1), . . . , c(m))<0, then a bias of −cmin is applied to all the c(k), where cmin is min(c(0), c(1), . . . , c(m)).

According to the above description, it can be seen that the calibration method provided in this embodiment is based on an error offset algorithm to obtain the phase error and the calibration amount of the multi-phase clock signals, and the process only requires a simple algebraic operation to obtain the calibration amount, which is simple to implement and conducive to reducing hardware expenditure as well as power consumption.

After obtaining the calibration amount of each phase clock signal, when the multi-phase clock signal generation circuit outputs the multi-phase clock signals, the controller can control the delay adjustment module, so that the delay adjustment module calibrates each phase clock signal according to the corresponding calibration amount and outputs the calibrated multi-phase clock signals.

In an embodiment of the present disclosure, as shown in FIG. 2 or 3B, the delay adjustment module is connected between the output end of the primary selector and the input end of the time difference obtaining module. The multi-phase clock signals are output after gating by the primary selector, and only one phase clock signal is output at a time to drive the post-stage circuit. The output phase clock signal is transmitted to the corresponding post-stage circuit after being calibrated by the delay adjustment module.

Figure 4:
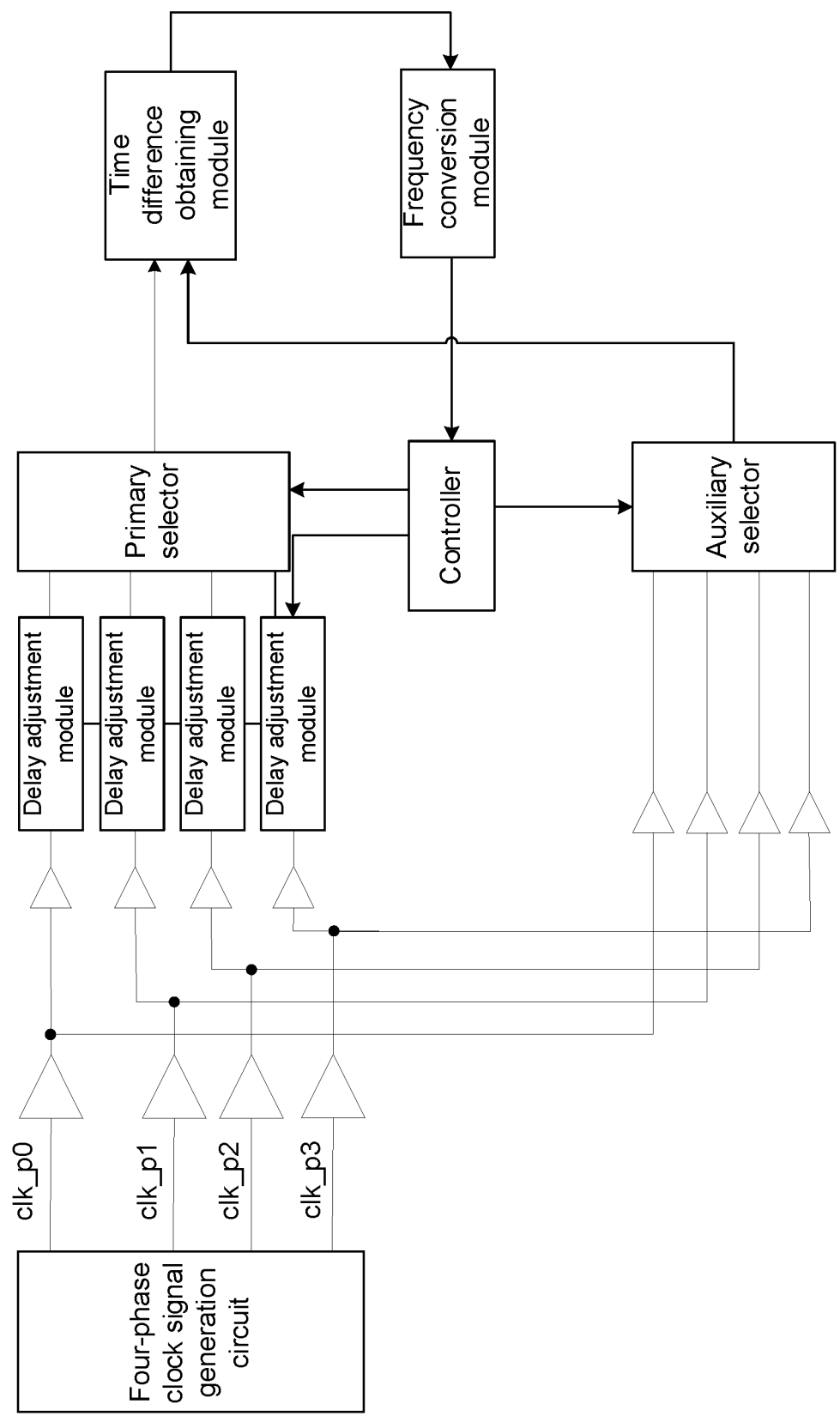
FIG. 4 shows a schematic structural diagram of a calibration device according to an embodiment of the present disclosure.

In another embodiment of the present disclosure, as shown in FIG. 4, one delay adjustment module is connected between each phase clock signal of the multi-phase clock signals and the corresponding input end of the primary selector. At each moment, clock signals of all phases can be output to drive the post-stage circuit, where each phase clock signal is calibrated by the corresponding delay adjustment module and then output. In practice, one phase clock signal or multi-phase clock signals can be selected for use according to the actual requirements.

The calibration method determines the delay adjustment amount of each primary clock signal by obtaining the time difference between each primary clock signal and its corresponding auxiliary clock signal under the first preset rule and the second preset rule, and then obtains the phase error between the multi-phase clock signals based on the delay adjustment amount, and afterwards obtains the calibration amount of the multi-phase clock signals based on the phase error, thus the phase calibration of the multi-phase clock signals can be achieved based on the calibration amount.

Based on the above description of the the calibration method, an embodiment of the present disclosure further provides a calibration device. Referring to FIGS. 2, 3B and 4, in an embodiment of the present disclosure, the calibration device includes a primary selector, an auxiliary selector, a time difference obtaining module, a controller, and a delay adjustment module.

The primary selector receives multi-phase clock signals and selects, under the control of a controller, a phase clock signal output from the multi-phase clock signals as a primary clock signal.

The auxiliary selector receives the multi-phase clock signals and selects, under the control of the controller, a corresponding phase clock signal output from the multi-phase clock signals as an auxiliary clock signal. A reference phase difference between the primary clock signal and the auxiliary clock signal is a predetermined value, and the predetermined value is a value not equal to zero.

The time difference obtaining module receives the primary clock signal and the auxiliary clock signal and obtains a time difference between the primary clock signal and the auxiliary clock signal.

The controller is connected to the primary selector, the auxiliary selector and the time difference obtaining module. The controller determines a delay adjustment amount of the primary clock signal according to the time difference between the primary clock signal and the auxiliary clock signal.

The delay adjustment module is connected to the primary selector and the controller, and adjusts a delay of the primary clock signal according to the delay adjustment amount such that a phase difference between the primary clock signal and the auxiliary clock signal is equal to or close to the predetermined value.

In an embodiment, the controller is further used to control the primary selector to gate each phase clock signal of the multi-phase clock signals as a first primary clock signal respectively and to control the auxiliary selector to gate a corresponding clock signal as a corresponding first auxiliary clock signal respectively according to a first preset rule, and to control the primary selector to gate each phase clock signal of the multi-phase clock signals as a second primary clock signal respectively and to control the auxiliary selector to gate a corresponding clock signal as a corresponding second auxiliary clock signal respectively according to a second preset rule. A reference phase difference between the first primary clock signal and its corresponding first auxiliary clock signal under the first preset rule is a first predetermined value, and a reference phase difference between the second primary clock signal and its corresponding second auxiliary clock signal under the second preset rule is a second predetermined value, where the first predetermined value is not equal to the second predetermined value. The time difference obtaining module obtains a time difference between each primary clock signal and its corresponding auxiliary clock signal under the first preset rule and the second preset rule, where the controller determines a delay adjustment amount of each primary clock signal based on the time difference, then obtains a phase error between the multi-phase clock signals based on the delay adjustment amount, and afterwards obtains a calibration amount of the multi-phase clock signals based on the phase error.

In an embodiment, the first predetermined value is 2×π/(m+1) and the second predetermined value is 4×π/(m+1), where m+1 is the number of phases of the multi-phase clock signals.

In an embodiment, as shown in FIGS. 3B and 4, the calibration device further includes a frequency conversion module. The frequency conversion module is connected between the time difference obtaining module and the controller, receives the time difference between the primary clock signal and its corresponding auxiliary clock signal and then acquires a frequency signal corresponding to the time difference according to the time difference, where the frequency signal is transmitted to the controller. The controller obtains the delay adjustment amount of each primary clock signal according to the frequency signal.

In an embodiment, the controller obtains the phase error between the multi-phase clock signals according to the following formula.

$$\Delta t(k+1, k) = -\left(\sum_{n=0}^{m}(c_A(n) - c_B(n))\right)/(m+1) + c_A(k) - c_B(k),$$

where $\Delta t(k+1,k)$ is a phase error between the $k_{th}$ phase clock signal and the $(k+1)_{th}$ phase clock signal, m+1 is a phase number of the multi-phase clock signals, $c_A(n)$ is a delay adjustment amount of the $n_{th}$ phase clock signal under the first preset rule; $c_B(n)$ is a delay adjustment amount of the $n_{th}$ phase clock signal under the second preset rule.

In an embodiment, the controller obtains the calibration amount of the multi-phase clock signals according to the following formula.

$$c(k) = \begin{cases} 0, k = 0 \\ \sum_{i=1}^{k} \Delta t(i, i-1), 0 < k < m+1 \end{cases},$$

where c(k) is a calibration amount of the $k_{th}$ phase clock signal.

In an embodiment, as shown in FIG. 3B, the delay adjustment module is connected between the output end of the primary selector and the input end of the time difference obtaining module.

In another embodiment of the present disclosure, as shown in FIG. 4, one delay adjustment module is connected between each phase clock signal of the multi-phase clock signals and the corresponding input end of the primary selector.

An embodiment of the present disclosure further provides a multi-phase clock circuit. The multi-phase clock circuit includes a clock signal generation circuit and the calibration device as described in the above embodiments, the calibration device includes at least a primary selector, an auxiliary selector, a time difference obtaining module, a controller and a delay adjustment module.

Specifically, the clock signal generation circuit generates multi-phase clock signals.

The primary selector receives the multi-phase clock signals and selects, under the control of a controller, a phase clock signal output from the multi-phase clock signals as a primary clock signal.

The auxiliary selector receives the multi-phase clock signals and selects, under the control of the controller, a corresponding phase clock signal outputted from the multi-phase clock signals as an auxiliary clock signal. A reference phase difference between the primary clock signal and the auxiliary clock signal is a predetermined value, and the predetermined value is a value not equal to zero.

The time difference obtaining module receives the primary clock signal and the auxiliary clock signal and obtains a time difference between the primary clock signal and the auxiliary clock signal.

The controller is connected to the primary selector, the auxiliary selector and the time difference obtaining module, and determines a delay adjustment amount of the primary clock signal according to the time difference between the primary clock signal and the auxiliary clock signal.

The delay adjustment module is connected to the primary selector and the controller, and adjusts a delay of the primary clock signal according to the delay adjustment amount such that a phase difference between the primary clock signal and the auxiliary clock signal is equal to or close to the predetermined value.

In related technology, voltage controlled oscillator (VCO) or PLL multiphase output delay may be adjusted for the purpose of phase calibration based on a phase frequency detectors and a low-frequency filter combined with digital control. However, adjusting the control voltage of the VCO is difficult to be directly applied to multi-output circuits, and adjusting the multi-phase output delay of the PLL has the problems of excessive hardware cost and power consumption. Unlike the solutions used in the related art, the calibration method and calibration device described in one or more embodiments of the present disclosure use the auxiliary clock signal as a reference for calibration, therefore, only a selector is added to the multi-phase clock circuit without introducing an additional reference source. The calibration method and calibration device achieve calibration by fine-tuning the clock tree delay of the multi-phase clock, instead of directly adjusting the multi-phase output of the PLL, which has low hardware cost and meets the requirements of low-power consumption. Moreover, the calibration method and the calibration device are quite flexible in terms of circuit configuration and algorithm flow. Further, the calibration method and calibration device described in one or more embodiments of the present disclosure can adjust the delay of the primary clock signal through the delay adjustment module, and realize the simultaneous output of one-phase signal or multi-phase clock signals by setting the number and position of the delay adjustment module, which is applicable to both single-output and multi-output circuits.

Therefore, the present disclosure effectively overcomes various shortcomings in the existing technology and has high industrial utilization value.

The above-mentioned embodiments are merely illustrative of the principle and effects of the present disclosure instead of limiting the present disclosure. Modifications or variations of the above-described embodiments may be made by those skilled in the art without departing from the spirit and scope of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A calibration method, comprising:
    gating each phase clock signal of multi-phase clock signals as a first primary clock signal respectively and gating a corresponding clock signal as a corresponding first auxiliary clock signal respectively according to a first preset rule, wherein a reference phase difference between the first primary clock signal and its corresponding first auxiliary clock signal under the first preset rule is a first predetermined value;
    gating each phase clock signal of the multi-phase clock signals as a second primary clock signal respectively and gating a corresponding clock signal as a corresponding second auxiliary clock signal respectively according to a second preset rule, wherein a reference phase difference between the second primary clock signal and its corresponding second auxiliary clock signal under the second preset rule is a second predetermined value, wherein the first predetermined value is not equal to the second predetermined value;

obtaining a time difference between each primary clock signal and its corresponding auxiliary clock signal under the first preset rule and the second preset rule;

determining a delay adjustment amount of each primary clock signal according to the time difference, and obtaining a phase error between the multi-phase clock signals according to the delay adjustment amount; and obtaining a calibration amount of the multi-phase clock signals according to the phase error.

2. The calibration method according to claim 1, wherein said determining of the delay adjustment amount of each primary clock signal according to the time difference comprises:

obtaining a frequency signal corresponding to the time difference; and obtaining the delay adjustment amount of each primary clock signal according to the frequency signal.

3. The calibration method according to claim 1, wherein said obtaining of the phase error between the multi-phase clock signals according to the delay adjustment amount comprises:

$$\Delta t(k+1, k) = -\left(\sum_{n=0}^{m}(c_A(n) - c_B(n))\right)/(m+1) + c_A(k) - c_B(k),$$

wherein $\Delta t(k+1,k)$ is a phase error between the $k_{th}$ phase clock signal and the $(k+1)_{th}$ phase clock signal, m+1 is a phase number of the multi-phase clock signals, $c_A(n)$ is a delay adjustment amount of the $n_{th}$ phase clock signal under the first preset rule, and $c_B(n)$ is a delay adjustment amount of the $n_{th}$ phase clock signal under the second preset rule.

4. The calibration method according to claim 3, wherein said obtaining of the calibration amount of the multi-phase clock signals according to the phase error comprises:

$$c(k) = \begin{cases} 0, k = 0 \\ \sum_{i=1}^{k}\Delta t(i, i-1), 0 < k < m+1 \end{cases},$$

wherein c(k) is a calibration amount of the $k_{th}$ phase clock signal.

5. The calibration method according to claim 1, wherein the first predetermined value is $2\times\pi/(m+1)$, and the second predetermined value is $4\times\pi/(m+1)$ wherein m+1 is the number of phases of the multi-phase clock signals.

6. A calibration device, comprising:
a primary selector for receiving multi-phase clock signals and selecting, under the control of a controller, a phase clock signal output from the multi-phase clock signals as a primary clock signal;
an auxiliary selector for receiving the multi-phase clock signals and selecting, under the control of the controller, a corresponding phase clock signal output from the multi-phase clock signals as an auxiliary clock signal, wherein a reference phase difference between the primary clock signal and the auxiliary clock signal is a predetermined value, and the predetermined value is a value not equal to zero;
a time difference obtaining module for receiving the primary clock signal and the auxiliary clock signal and obtaining a time difference between the primary clock signal and the auxiliary clock signal;
a controller, connected to the primary selector, the auxiliary selector and the time difference obtaining module, for determining a delay adjustment amount of the primary clock signal according to the time difference between the primary clock signal and the auxiliary clock signal; and
a delay adjustment module, connected to the primary selector and the controller, for adjusting a delay of the primary clock signal according to the delay adjustment amount such that a phase difference between the primary clock signal and the auxiliary clock signal is equal to or close to the predetermined value.

7. The calibration device according to claim 6, wherein the controller is further used to control the primary selector to gate each phase clock signal of the multi-phase clock signals as a first primary clock signal respectively and to control the auxiliary selector to gate a corresponding clock signal as a corresponding first auxiliary clock signal respectively according to a first preset rule, and to control the primary selector to gate each phase clock signal of the multi-phase clock signals as a second primary clock signal respectively and to control the auxiliary selector to gate a corresponding clock signal as a corresponding second auxiliary clock signal respectively according to a second preset rule; wherein a reference phase difference between the first primary clock signal and its corresponding first auxiliary clock signal under the first preset rule is a first predetermined value, and a reference phase difference between the second primary clock signal and its corresponding second auxiliary clock signal under the second preset rule is a second predetermined value, wherein the first predetermined value is not equal to the second predetermined value;

wherein the time difference obtaining module obtains a time difference between each primary clock signal and its corresponding auxiliary clock signal under the first preset rule and the second preset rule, wherein the controller determines a delay adjustment amount of each primary clock signal based on the time difference, then obtains a phase error between the multi-phase clock signals based on the delay adjustment amount, and afterwards obtains a calibration amount of the multi-phase clock signals based on the phase error.

8. The calibration device according to claim 7, further comprising a frequency conversion module;
wherein the frequency conversion module is connected between the time difference obtaining module and the controller for receiving the time difference between the primary clock signal and its corresponding auxiliary clock signal and acquiring a frequency signal corresponding to the time difference according to the time difference;
wherein the controller obtains the delay adjustment amount of each primary clock signal according to the frequency signal.

9. The calibration device according to claim 7, wherein the controller obtains the phase error between the multi-phase clock signals according to the following equation:

$$\Delta t(k+1, k) = -\left(\sum_{n=0}^{m}(c_A(n) - c_B(n))\right)/(m+1) + c_A(k) - c_B(k),$$

wherein Δt(k+1,k) k is a phase error between the $k_{th}$ phase clock signal and the $(k+1)_{th}$ phase clock signal, m+1 is a phase number of the multi-phase clock signals, $c_A(n)$ is a delay adjustment amount of the $n_{th}$ phase clock signal under the first preset rule; $c_B(n)$ is a delay adjustment amount of the $n_{th}$ phase clock signal under the second preset rule.

10. The calibration device according to claim 9, wherein the controller obtains the calibration amount of the multi-phase clock signals according to the following equation:

$$c(k) = \begin{cases} 0, k = 0 \\ \sum_{i=1}^{k} \Delta t(i, i-1), 0 < k < m+1 \end{cases},$$

wherein c(k) is a calibration amount of the $k_{th}$ phase clock signal.

11. The calibration device according to claim 6, wherein the delay adjustment module is connected between an output end of the primary selector and an input end of the time difference obtaining module.

12. The calibration device according to claim 6, wherein one said delay adjustment module is connected between each phase clock signal of the multi-phase clock signals and a corresponding input end of the primary selector.

13. The calibration device according to claim 7, wherein the first predetermined value is 2×π/(m+1), and the second predetermined value is 4×π/(m+1), wherein m+1 is the number of phases of the multi-phase clock signals.

14. A multi-phase clock circuit, comprising:
a clock signal generation circuit for generating multi-phase clock signals;
a primary selector for receiving the multi-phase clock signals and selecting, under the control of a controller, a phase clock signal output from the multi-phase clock signals as a primary clock signal;
an auxiliary selector for receiving the multi-phase clock signals and selecting, under the control of the controller, a corresponding phase clock signal output from the multi-phase clock signals as an auxiliary clock signal, wherein a reference phase difference between the primary clock signal and the auxiliary clock signal is a predetermined value, and the predetermined value is a value not equal to zero;
a time difference obtaining module for receiving the primary clock signal and the auxiliary clock signal and obtaining a time difference between the primary clock signal and the auxiliary clock signal;
a controller, connected to the primary selector, the auxiliary selector and the time difference obtaining module, for determining a delay adjustment amount of the primary clock signal according to the time difference between the primary clock signal and the auxiliary clock signal; and
a delay adjustment module, connected to the primary selector and the controller, for adjusting a delay of the primary clock signal according to the delay adjustment amount such that a phase difference between the primary clock signal and the auxiliary clock signal is equal to or close to the predetermined value.

\* \* \* \* \*